US012797982B2

(12) United States Patent
Mao et al.

(10) Patent No.: US 12,797,982 B2
(45) Date of Patent: Nov. 17, 2026

(54) ACTIVE METAL BRAZING SUBSTRATE MATERIAL

(71) Applicant: TONG HSING ELECTRONIC INDUSTRIES, LTD., Taipei City (TW)

(72) Inventors: Chih-Wei Mao, Taipei City (TW); Tsung-Ying Chang, Taipei City (TW); Chung-Ho Wei, Taipei City (TW); Ming-Yi Hsu, Taipei City (TW); Chi-Wen Huang, Taipei City (TW)

(73) Assignee: TONG HSING ELECTRONIC INDUSTRIES, LTD., Taipei City (TW)

( * ) Notice: Subject to any disclaimer, the term of this patent is extended or adjusted under 35 U.S.C. 154(b) by 293 days.

(21) Appl. No.: 18/486,168

(22) Filed: Oct. 13, 2023

(65) Prior Publication Data

US 2025/0010390 A1 Jan. 9, 2025

(30) Foreign Application Priority Data

Jul. 6, 2023 (TW) ................................ 112125169

(51) Int. Cl.
*B32B 15/04* (2006.01)
*B23K 1/00* (2006.01)
(Continued)

(52) U.S. Cl.
CPC ........ *B23K 1/0016* (2013.01); *B23K 35/0233* (2013.01); *B23K 35/0238* (2013.01);
(Continued)

(58) Field of Classification Search
CPC ............ B23K 2311/08; B23K 2311/12; B23K 2103/52; B23K 2101/36; B23K 1/0016; B23K 35/0233; B23K 35/0238; B23K 35/025; B23K 35/3006; B23K 35/302; B32B 15/04; B32B 15/018; B32B 15/01; B32B 15/043; B32B 15/20; H10W 40/255; C23C 28/02; C23C 28/021; C23C 28/023; C23C 30/00; C23C 30/005;
(Continued)

(56) References Cited

U.S. PATENT DOCUMENTS

2014/0291699 A1* 10/2014 Yano ..................... C04B 37/026 257/77
2025/0010408 A1* 1/2025 Mao ..................... B23K 35/286

* cited by examiner

*Primary Examiner* — Michael E. La Villa
(74) *Attorney, Agent, or Firm* — Li & Cai Intellectual Property Office

(57) ABSTRACT

An active metal brazing substrate material and a method for producing the same are provided. The active metal brazing substrate material includes a ceramic substrate layer, a first brazing layer, a second brazing layer, and a conductive metal layer that are sequentially stacked. The first brazing layer includes a first metal composite material, which includes silver (Ag), copper (Cu), and a first active metal element. Based on a total weight of the first metal composite material being 100 parts by weight, a silver content is not less than 50 parts by weight. The second brazing layer includes a second metal composite material. The second metal composite material includes a low melting point metal element (e.g., Sn), copper (Cu), and a second active metal element, but does not include silver. A melting point of the low melting metal element is between 130 °C and 350 °C.

7 Claims, 3 Drawing Sheets

(51) Int. Cl.

| | |
|---|---|
| ***B23K 35/02*** | (2006.01) |
| ***B23K 35/30*** | (2006.01) |
| ***B32B 15/01*** | (2006.01) |
| ***B32B 15/20*** | (2006.01) |
| ***C23C 28/02*** | (2006.01) |
| ***C23C 30/00*** | (2006.01) |
| *B23K 101/36* | (2006.01) |
| *B23K 103/00* | (2006.01) |
| *H10W 40/25* | (2026.01) |

(52) U.S. Cl.
CPC ........ *B23K 35/025* (2013.01); *B23K 35/3006* (2013.01); *B23K 35/302* (2013.01); *B32B 15/01* (2013.01); *B32B 15/018* (2013.01); *B32B 15/04* (2013.01); *B32B 15/043* (2013.01); *B32B 15/20* (2013.01); *C23C 28/02* (2013.01); *C23C 28/021* (2013.01); *C23C 28/023* (2013.01); *C23C 30/00* (2013.01); *C23C 30/005* (2013.01); *B23K 2101/36* (2018.08); *B23K 2103/52* (2018.08); *B32B 2311/08* (2013.01); *B32B 2311/12* (2013.01); *H10W 40/255* (2026.01); *Y10T 428/12576* (2015.01); *Y10T 428/12736* (2015.01); *Y10T 428/12743* (2015.01); *Y10T 428/1275* (2015.01); *Y10T 428/12882* (2015.01); *Y10T 428/12896* (2015.01); *Y10T 428/12903* (2015.01); *Y10T 428/1291* (2015.01); *Y10T 428/2495* (2015.01); *Y10T 428/24959* (2015.01); *Y10T 428/24967* (2015.01); *Y10T 428/24975* (2015.01); *Y10T 428/263* (2015.01); *Y10T 428/264* (2015.01); *Y10T 428/265* (2015.01)

(58) Field of Classification Search
CPC ..... Y10T 428/12896; Y10T 428/12903; Y10T 428/12736; Y10T 428/12743; Y10T 428/1275; Y10T 428/1291; Y10T 428/12882; Y10T 428/12576; Y10T 428/2495; Y10T 428/24959; Y10T 428/24967; Y10T 428/24975; Y10T 428/263; Y10T 428/264; Y10T 428/265
See application file for complete search history.

ACTIVE METAL BRAZING SUBSTRATE MATERIAL

CROSS-REFERENCE TO RELATED PATENT APPLICATION

This application claims the benefit of priority to Taiwan Patent Application No. 112125169, filed on Jul. 6, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a substrate material, and more particularly to an active metal brazing (AMB) substrate material and a method for producing the same.

BACKGROUND OF THE DISCLOSURE

With the promotion of energy-saving and carbon reduction policies in various countries, the market for global electric vehicles (EV) is currently booming. In recent years, with the successive launching of 800-volt high-voltage vehicle products by major automakers, demands for silicon carbide (SiC) ceramic substrate materials have grown rapidly.

However, for power devices that are based on the silicon carbide (SiC) ceramic substrate materials, requirements on a voltage, a frequency, and an operating temperature thereof are constantly increased. Hence, the ceramic substrate materials also need to be improved in terms of heat dissipation and reliability.

In the related art, conventional direct-bonding-copper (DBC) ceramic substrates are prepared by eutectic bonding, and there is no bonding material between a copper layer and a ceramic substrate. However, in the process of a high-temperature operation, a large thermal stress is often generated due to differences in thermal expansion coefficients between the copper layer and the ceramic substrate (e.g., $Al_2O_3$ or AlN), which causes the copper layer to peel off from a surface of the ceramic substrate. Therefore, the conventional direct-bonding-copper (DBC) ceramic substrates can no longer meet packaging requirements of high temperature, high power, high heat dissipation, and high reliability.

Recently, the conventional direct-bonding-copper (DBC) ceramic substrates have gradually been replaced in popularity by active metal brazing (AMB) substrate materials. Active metal elements (e.g., Ti, Zr, Ta, Nb, V, or Hf) of the active metal brazing substrate materials can wet a side surface of a ceramic substrate, so as to braze an ultra-thick copper foil onto the ceramic substrate at a high temperature. A brazing layer formed between the ultra-thick copper foil and the ceramic substrate through the active metal brazing process has a high connection strength.

In conventional active metal brazing paste materials, a silver-copper-titanium (Ag—Cu—Ti) metal composite material is commonly used. In the above-mentioned silver-copper-titanium metal composite material, a silver content usually exceeds 50 wt % (weight percent concentration), and can even exceed 70 wt %.

A brazing temperature of the conventional active metal brazing paste material that adopts the silver-copper-titanium (Ag—Cu—Ti) metal composite material is usually greater than 900 °C. (e.g., 915 °C). Since a brazing layer formed of the conventional active metal brazing paste material contains a large amount of silver (i.e., a noble metal), material and manufacturing costs of the active metal brazing ceramic substrates remain high. Furthermore, the problem of electromigration caused by silver (Ag) residue after an etching process has long been an issue that needs be solved.

SUMMARY OF THE DISCLOSURE

In response to the above-referenced technical inadequacies, the present disclosure provides an active metal brazing (AMB) substrate material and a method for producing the same, which can reduce a usage amount of a silver metal element and lower a brazing temperature to below 900 °C, thereby reducing an impact of high temperature on metal properties, and simultaneously reducing material costs and manufacturing costs.

In order to solve the above-mentioned problems, one of the technical aspects adopted by the present disclosure is to provide an active metal brazing substrate material that includes a ceramic substrate layer, an active metal layer, and a conductive metal layer. The active metal layer includes a first brazing layer and a second brazing layer. The first brazing layer is disposed on a side surface of the ceramic substrate layer. A composition of the first brazing layer includes a first metal composite material, and the first metal composite material includes a silver (Ag) metal element, a copper (Cu) metal element, and a first active metal element. Based on a total weight of the first metal composite material being 100 parts by weight, a content of the silver (Ag) metal element is not less than 50 parts by weight. The second brazing layer is disposed on a side surface of the first brazing layer away from the ceramic substrate layer. A composition of the second brazing layer includes a second metal composite material. The second metal composite material includes a low melting point metal element, a copper (Cu) metal element, and a second active metal element. The second metal composite material does not includes any silver (Ag) metal element. A melting point of the low melting point metal element is between 130 °C and 350 °C. Based on a total weight of the second metal composite material being 100 parts by weight, a content of the low melting point metal element is between 10 parts by weight and 40 parts by weight. A sum of a thickness of the first brazing layer and a thickness of the second brazing layer is not less than 12 micrometers, the thickness of the first brazing layer is not less than 5 micrometers, and the thickness of the second brazing layer is not less than 10 micrometers. The conductive metal layer is disposed on a side surface of the second brazing layer away from the first brazing layer.

In order to solve the above-mentioned problems, another one of the technical aspects adopted by the present disclosure is to provide a method for producing an active metal brazing substrate material, which includes performing a first brazing layer preparation operation, performing a second brazing layer preparation operation, and performing a conductive metal layer preparation operation.

The first brazing layer preparation operation includes: coating a first active solder paste on a side surface of a ceramic substrate layer, and drying the first active solder paste to form a first brazing layer. The first active solder paste contains first active solder powders, and the first active solder powders are composed of silver powders, copper powders, and first active metal powders. Based on a total weight of the first active solder powders being 100 parts by weight, an amount of the silver powders is not less than 50 parts by weight. The second brazing layer preparation operation includes: coating a second active solder paste on a side surface of the first brazing layer away from the ceramic substrate layer, and drying the second active solder paste to form a second brazing layer. The first brazing layer and the second brazing layer together form an active metal layer. The second active solder paste contains second active solder powders, and the second active solder powders are composed of low melting point metal powders, copper powders, and second active metal powders. The low melting point metal powders have a melting point of between 130 °C and 350 °C. Based on a total weight of the second active solder powders being 100 parts by weight, an amount of the low melting point metal powders is between 10 parts by weight and 40 parts by weight. The second active solder powders do not contain any silver powder. The conductive metal layer preparation operation includes: disposing a conductive metal layer on a side surface of the second brazing layer away from the first brazing layer, and brazing the conductive metal layer on the ceramic substrate layer through the active metal layer composed of the first brazing layer and the second brazing layer under a high-temperature vacuum sintering process. A sum of a thickness of the first brazing layer and a thickness of the second brazing layer is not less than 12 micrometers, the thickness of the first brazing layer is not less than 5 micrometers, and the thickness of the second brazing layer is not less than 10 micrometers.

Therefore, in the active metal brazing (AMB) substrate material and the method for producing the same provided by the present disclosure, through the configuration of the first brazing layer and the second brazing layer, the usage amount of the silver metal element can be reduced, and the brazing temperature can be lowered to below 900 °C, thereby reducing the impact of high temperature on metal properties, and simultaneously reducing the material costs and the manufacturing costs.

More specifically, in the present disclosure, the second brazing layer is disposed between the first brazing layer and the conductive metal layer. The second brazing layer contains the low melting point metal element, but does not contain the silver (Ag) metal element. The second brazing layer is configured to have a certain thickness, so that the content of the silver (Ag) metal element in the active metal layer can be reduced, thereby effectively reducing the material cost and the manufacturing cost of the active metal brazing ceramic substrate. In addition, the problem of electro-migration caused by silver residues can also be effectively improved. Lastly, the active metal brazing (AMB) substrate material provided by the present disclosure can further be etched to form a circuit pattern on the ceramic substrate by exposure and development, and can be applied to a high-power module for energy conversion, an electric vehicle, and a charging system.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
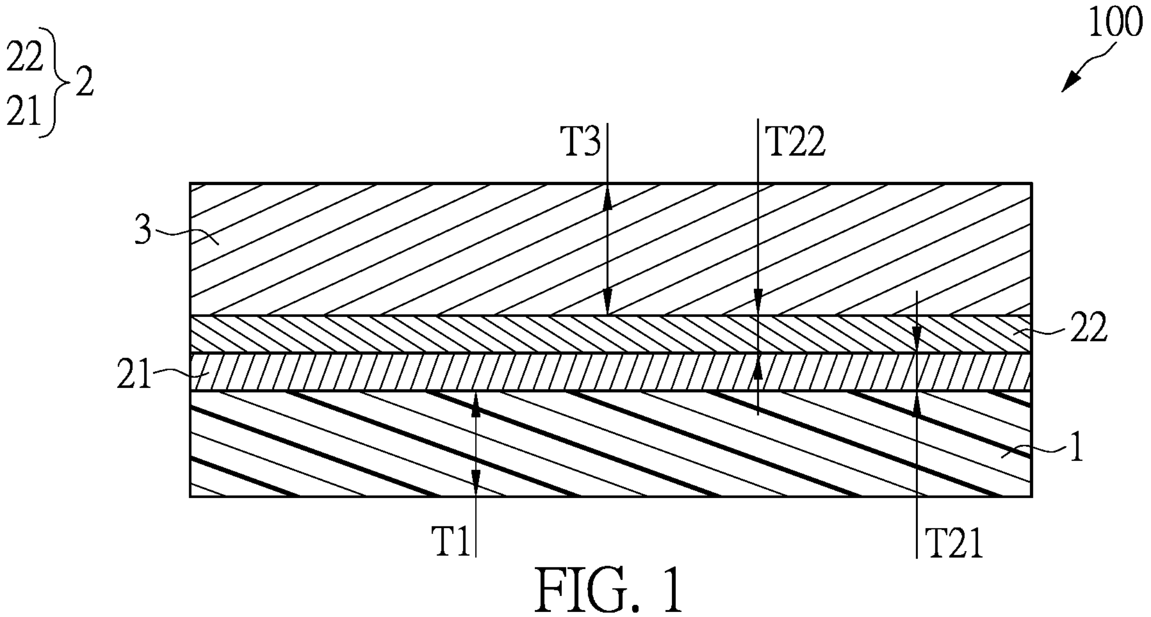
FIG. 1 is a schematic view of an active metal brazing substrate material according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

[Active Metal Brazing Substrate Material]

Referring to FIG. 1, an embodiment of the present disclosure provides an active metal brazing substrate material 100. The active metal brazing substrate material 100 includes a ceramic substrate layer 1, an active metal layer 2, and a conductive metal layer 3. The active metal layer 2 is disposed between the ceramic substrate layer 1 and the conductive metal layer 3 for bonding the ceramic substrate layer 1 and the conductive metal layer 3 together. More specifically, the active metal layer 2 includes a first brazing layer 21 and a second brazing layer 22.

The first brazing layer 21 is disposed on a side surface of the ceramic substrate layer 1, the second brazing layer 22 is disposed on a side surface of the first brazing layer 21 away from the ceramic substrate layer 1, and the conductive metal layer 3 is disposed on a side surface of the second brazing layer 22 away from the first brazing layer 21.

Figure 2:
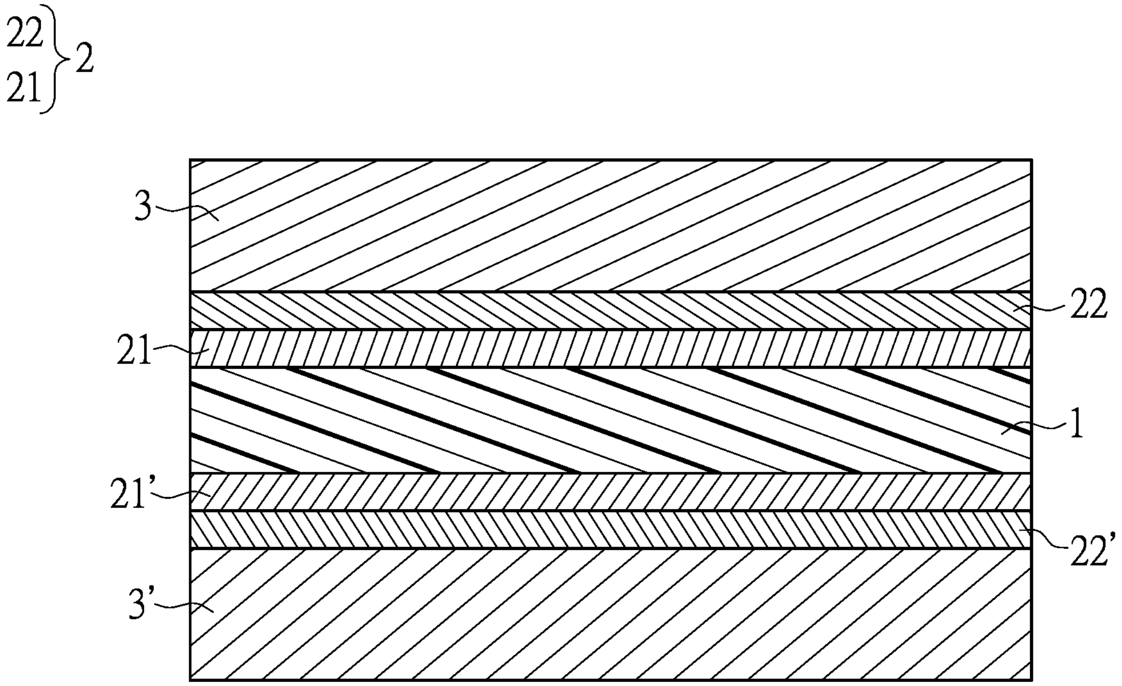
FIG. 2 is a schematic view showing two active metal layers respectively formed on both sides of a ceramic substrate.

It is worth mentioning that, in the present embodiment, the first brazing layer 21, the second brazing layer 22, and the conductive metal layer 3 are sequentially disposed on only one side surface of the ceramic substrate layer 1. However, the present disclosure is not limited thereto. For example, as shown in FIG. 2, in another embodiment of the present disclosure, another first brazing layer 21', another second brazing layer 22', and another conductive metal layer 3' can also be sequentially disposed on another side surface of the ceramic substrate layer 1. In this way, a symmetrical substrate structure having two active metal layers respectively disposed on both side surfaces of the ceramic substrate layer 1 can be formed.

The ceramic substrate layer 1 is described in detail below.

The ceramic substrate layer 1 can be, for example, at least one of a silicon nitride (SiN) ceramic substrate, a silicon carbide (SiC) ceramic substrate, an aluminum nitride (AlN) ceramic substrate, and an aluminum oxide ($Al_2O_3$) ceramic substrate. In the present embodiment, the ceramic substrate layer 1 is preferably the silicon nitride (SiN) ceramic substrate. In addition, a thickness T1 of the ceramic substrate layer 1 can be, for example, between 100 micrometers and 1,000 micrometers, but the present disclosure is not limited thereto.

The first brazing layer 21 is described in detail below.

As shown in FIG. 1, a composition of the first brazing layer 21 includes a first metal composite material. The first metal composite material includes: a silver (Ag) metal element, a copper (Cu) metal element, and a first active metal element.

It is worth mentioning that the composition of the first brazing layer 21 can further include a small amount of a low melting point metal element, which can be obtained by melting a low melting point metal element of the second brazing layer 22 during a vacuum sintering process for preparing the active metal brazing substrate material, so that the low melting point metal element can be diffused from the second brazing layer 22 into the first brazing layer 21 along copper defects in the second brazing layer 22.

Furthermore, in some embodiments of the present disclosure, the first active metal element can be at least one selected from the group consisting of: titanium (Ti), zirconium (Zr), tantalum (Ta), niobium (Nb), vanadium (V), hafnium (Hf), and a metal hydride of any one of the above-mentioned metal elements. For example, the metal hydride can be at least one selected from the group consisting of: titanium hydride ($TiH_2$), zirconium hydride ($ZrH_2$), tantalum hydride ($TaH_2$), niobium hydride (NbH), vanadium hydride ($VH_2$), and hafnium hydride ($H_2Hf_2$).

In some embodiments of the present disclosure, the first active metal element is preferably at least one of titanium (Ti) and titanium hydride ($TiH_2$). Accordingly, the first brazing layer 21 can be a silver (Ag)-copper (Cu)-titanium (Ti) brazing layer (i.e., Ag—Cu—Ti paste).

In terms of content range, the first metal composite material is the main composition of the first brazing layer 21. For example, a weight percent concentration of the first metal composite material in the first brazing layer 21 is not less than 80 wt %, and is preferably not less than 90 wt %.

Furthermore, in the first brazing layer 21, based on a total weight of the first metal composite material being 100 parts by weight, a content of the silver (Ag) metal element is not less than 50 parts by weight, and is preferably between 50 parts by weight and 75 parts by weight. In terms of thickness, a thickness T21 of the first brazing layer 21 is not less than 5 micrometers, and is preferably between 5 micrometers and 24 micrometers.

According to the above configuration, since the first brazing layer 21 that is in contact with the ceramic substrate layer 1 contains a certain amount of silver (Ag) and has a certain thickness, a bonding force between the ceramic substrate layer 1 and the conductive metal layer 3 can be increased. If the silver (Ag) content in the first brazing layer 21 is too low, or the thickness of the first brazing layer 21 is too thin, the first brazing layer 21 is not capable of enabling the active metal brazing substrate material 100 to have proper physical properties. If the silver (Ag) content in the first brazing layer 21 is too high, or the thickness of the first brazing layer 21 is too thick, material and manufacturing costs of the active metal brazing substrate material 100 will be too high.

It is worth mentioning that the first active metal element (e.g., Ti) in the first brazing layer 21 is capable of wetting a surface of the ceramic substrate layer 1 during the vacuum sintering process, and reacting with a ceramic material (e.g., SiN) of the ceramic substrate layer 1, so as to form a compound, such as titanium nitride (TiN), titanium silicide (TiSi), or titanium disilicide ($TiSi_2$). Accordingly, a bonding force between the active metal layer 2 and the ceramic substrate layer 1 can be enhanced.

On the other hand, since the first brazing layer 21 contains the first active metal element (e.g., Ti), an electrical resistance of the active metal brazing substrate material 100 can become smaller.

Specifically, the silver (Ag) metal element and the copper (Cu) metal element in the first brazing layer 21 can react with each other, so as to form a silver-copper alloy (i.e., Ag—Cu alloy).

Furthermore, the first metal composite material of the first brazing layer 21 can be formed by mixing and vacuum sintering silver powders (Ag metal powders), copper powders (Cu metal powders), active metal powders (e.g., Ti metal powders), and/or the silver-copper alloy (i.e., Ag—Cu alloy).

The second brazing layer 22 is described in detail below.

A composition of the second brazing layer 22 includes a second metal composite material. The second metal composite material includes: the low melting point metal element, a copper (Cu) metal element, and a second active metal element. Preferably, the second metal composite material only includes (or is only composed of) the low melting point metal element, the copper (Cu) metal element, and the second active metal element.

It is worth mentioning that, in an exemplary embodiment of the present disclosure, the second metal composite material of the second brazing layer 22 does not contain any silver (Ag) metal element.

As mentioned above, the low melting point metal element in the second brazing layer 22 can be firstly melted during the vacuum sintering process for preparing the active metal brazing substrate material, and then at least partially diffuses into the first brazing layer 21 along defects of the copper (Cu) metal element. However, the present disclosure is not limited thereto.

The low melting point metal element can, for example, have a melting point (Tm) of between 130 °C and 350 °C, and a liquid density of between 5 g/cm$^3$ and 12 g/cm$^3$ at the melting point.

In some embodiments of the present disclosure, the low melting point metal element can be at least one of a tin (Sn)

metal element, a bismuth (Bi) metal element, an indium (In) metal element, a lead (Pb) metal element, and a cadmium (Cd) metal element.

For example, the tin (Sn) metal element has a melting point of about 232 °C and a liquid density of about 7 g/cm$^3$ at the melting point. The bismuth (Bi) metal element has a melting point of about 271.5 °C and a liquid density of about 10 g/cm$^3$ at the melting point. The indium (In) metal element has a melting point of about 156.5 °C and a liquid density of about 7 g/cm$^3$ at the melting point. The lead (Pb) metal element has a melting point of about 327.5 °C and a liquid density of about 8 g/cm$^3$ at the melting point. The cadmium (Cd) metal element has a melting point of about 321 °C and a liquid density of about 8 g/cm$^3$ at the melting point.

In addition, the low melting point metal element mentioned above can, for example, have an electrical resistivity of not greater than 1500 nΩ·m at a temperature of between 0 °C and 25 °C, which is suitable for being applied to conductive soldering materials.

Furthermore, similar to the first active metal element, the second active metal element can be at least one selected from the group consisting of: titanium (Ti), zirconium (Zr), tantalum (Ta), niobium (Nb), vanadium (V), hafnium (Hf), and a metal hydride of any one of the above-mentioned metal elements.

For example, the metal hydride can be at least one selected from the group consisting of: titanium hydride ($TiH_2$), zirconium hydride ($ZrH_2$), tantalum hydride ($TaH_2$), niobium hydride (NbH), vanadium hydride ($VH_2$), and hafnium hydride ($H_2Hf_2$).

In a specific embodiment of the present disclosure, the low melting point metal element is the tin (Sn) metal element, and the second active metal element is titanium (Ti). Accordingly, the second brazing layer 22 can be a tin (Sn)-copper (Cu)-titanium (Ti) brazing layer (i.e., Sn—Cu—Ti paste).

In terms of content range, the second metal composite material is the main composition of the second brazing layer 22. For example, a weight percent concentration of the second metal composite material in the second brazing layer 22 is not less than 80 wt %, and is preferably not less than 90 wt %.

Specifically, in the second brazing layer 22, based on a total weight of the second metal composite material being 100 parts by weight, a content of the low melting point metal element (e.g., the Sn metal element) is between 10 parts by weight and 40 parts by weight, and is preferably between 15 parts by weight and 35 parts by weight.

In addition, a content of the copper (Cu) metal element is between 55 parts by weight and 90 parts by weight, and is preferably between 60 parts by weight and 85 parts by weight. A content of the second active metal element (e.g., Ti) is between 1 part by weight and 5 parts by weight, and is preferably between 2 parts by weight and 4 parts by weight.

In some embodiments of the present disclosure, the content of the copper (Cu) metal element in the second brazing layer 22 (e.g., 55 parts by weight to 90 parts by weight) is greater than the content of the low melting point metal element in the second brazing layer 22 (e.g., 10 parts by weight to 40 parts by weight). In addition, the content of the copper (Cu) metal element in the second brazing layer 22 (e.g., 55 parts by weight to 90 parts by weight) is greater than a content of the copper (Cu) metal element in the first brazing layer 21 (e.g., 10 parts by weight to 40 parts by weight).

In terms of thickness, a thickness T22 of the second brazing layer 22 is not less than 10 micrometers, and is preferably between 10 micrometers and 24 micrometers.

It is worth mentioning that the low melting point metal element in the second brazing layer 22 can react with the copper (Cu) metal element during the vacuum sintering process. For example, in a specific embodiment, the low melting point metal element is the tin (Sn) metal element. When a heating temperature is higher than the melting point of the tin (Sn) metal element (e.g., higher than 240 °C), the tin (Sn) metal element is melted first. Then, in a situation where an amount of the copper (Cu) metal element is excessive, the tin (Sn) metal element can react with the copper (Cu) metal element to form a $Cu_3Sn$ alloy. The $Cu_3Sn$ alloy is present in the second brazing layer 22, and is also present at an interface between the second brazing layer 22 and the conductive metal layer 3 (e.g., a metal copper foil). The $Cu_3Sn$ alloy can further react with more of the tin (Sn) metal element, so as to form a $Cu_6Sn_5$ alloy. Therefore, the second brazing layer 22 can be more tightly bonded to the conductive metal layer 3.

Furthermore, the second metal composite material of the second brazing layer 22 can be formed by mixing and vacuum sintering low melting point metal powders, copper powders (Cu metal powders), and second active metal powders (e.g., Ti metal powders). In addition, the second active metal element (i.e., Ti) in the second brazing layer 22 can diffuse to the ceramic substrate layer 1 through the first brazing layer 21 during the vacuum sintering process, and reacts with the ceramic material (e.g., SiN) to form compounds, such as titanium nitride (TiN), titanium silicide (TiSi), or titanium disilicide ($TiSi_2$). In this way, the bonding force between the active metal layer 2 and the ceramic substrate layer 1 can be improved.

A thickness ratio of the active metal layer and a content of each metal element are described in detail below.

From another perspective, a total thickness of the active metal layer 2 (i.e., a sum of the thickness T21 of the first brazing layer 21 and the thickness T22 of the second brazing layer 22) is not less than 12 micrometers, is preferably not less than 15 micrometers, and is more preferably between 15 micrometers and 32 micrometers. The thickness ratio between the thickness T21 of the first brazing layer 21 and the thickness T22 of the second brazing layer 22 is preferably between 15% to 50%: 50% to 85%, and is more preferably between 20% to 45%: 55% to 80% (based on the sum of the two ratios being 100%).

Accordingly, based on a total weight of all metal elements (i.e., the low melting point metal element, Ag, Cu, and the first and second active metal elements) in the active metal layer 2 being 100 wt %, a content of the low melting point metal element (e.g., Sn) is between 5 wt % and 35 wt %, and is preferably between 10 wt % and 35 wt %. A content of the silver (Ag) metal element is not greater than 45 wt %, and is preferably between 15 wt % and 45 wt %.

In addition, a total content of the first active metal element and the second active metal element (e.g., Ti metal element) is between 1 wt % and 5 wt %, and is preferably between 2 wt % and 4 wt %. The copper (Cu) metal element is a remaining metal element.

Addition of the silver (Ag) metal element can be used as a stabilizer to improve device performance.

According to the above configuration, the second brazing layer 22 is disposed between the first brazing layer 21 and the conductive metal layer 3. The second brazing layer 22 contains the low melting point metal element (e.g., Sn), but does not contain the silver (Ag) metal element. The second brazing layer 22 is configured to have a certain thickness, so that a usage amount of the silver (Ag) metal element in the active metal layer 2 can be effectively reduced, so as to effectively reduce the material cost and the manufacturing cost of the active metal brazing (ceramic) substrate material, and effectively improve the problem of electro-migration caused by residue of the silver (Ag) metal element. In addition, the second brazing layer 22 can firmly bond the first brazing layer 21 to the conductive metal layer 3.

In some embodiments of the present disclosure, due to the increase of the content of the low melting point metal element (e.g., Sn), the active metal layer 2 can be brazed at a brazing temperature of not greater than 900 °C. In a specific embodiment, the brazing temperature at which the active metal layer 2 is heated is between 450 °C and 900 °C, but the present disclosure is not limited thereto. Since the active metal layer 2 has a lower brazing temperature than that of the related art, the active metal layer 2 can effectively improve an impact of high temperature on metal properties.

The conductive metal layer 3 is described in detail as follows.

As shown in FIG. 1, the conductive metal layer 3 is disposed on the side surface of the second brazing layer 22 away from the first brazing layer 21. The conductive metal layer 3 can be, for example, a metal copper foil, a metal aluminum foil, or a copper-aluminum alloy foil (i.e., a Cu—Al alloy foil). In the present embodiment, the conductive metal layer 3 is preferably the metal copper foil.

In addition, a thickness T3 of the conductive metal layer 3 can be, for example, between 50 micrometers and 800 micrometers, but the present disclosure is not limited thereto.

It is worth mentioning that the conductive metal layer 3 (i.e., an oxygen-free metal copper foil) can be brazed onto the ceramic substrate layer 1 through the active metal layer 2 by a high-temperature vacuum sintering process. For example, the high-temperature vacuum sintering process can include a first-stage heat treatment procedure and a second-stage heat treatment procedure. A temperature condition of the first-stage heat treatment procedure is not greater than 500 °C. A temperature condition of the second-stage heat treatment procedure is between 450 °C and 900 °C. (which needs to be within a suitable brazing temperature range).

According to the above configuration, the active metal brazing substrate material provided in the embodiment of the present disclosure can effectively reduce the usage amount of the silver (Ag) metal element, and reduce the brazing temperature to below 900 °C, thereby reducing the impact of high temperature on metal properties, while simultaneously reducing the material cost and the manufacturing cost of the active metal brazing substrate material.

It is worth mentioning that the "brazing temperature" of the active metal layer 2 in the present embodiment refers to a temperature at which the metal elements can be melted to have sufficient fluidity for wetting a surface of the workpiece (i.e., a ceramic substrate). Generally, a soldering temperature of above 450 °C is referred to as the brazing temperature. The brazing temperature can be, for example, determined by a desired brazing temperature through a ternary metallographic diagram formed by three metal elements, and appropriate weight percent concentrations of these three metal elements.

Alternatively, through the known weight percent concentrations of these three metal elements, the ternary metallographic diagram formed by the three metal elements can be used to find out a suitable brazing temperature range.

For example, a suitable brazing temperature is a temperature higher than a liquidus temperature of the ternary metal elements of the brazing metal materials, which can enable the brazing metal materials to have sufficient fluidity. However, the present disclosure is not limited thereto.

[Method for Producing Active Metal Brazing Substrate Material]

The structural and material characteristics of the active metal brazing substrate material are described above. A method for producing an active metal brazing substrate material of the present disclosure is described in detail below. As shown in FIG. 3A to FIG. 3D, an embodiment of the present disclosure also provides a method for producing an active metal brazing substrate material, which includes step S110, step S120, step S130, and step S140.

It should be noted that a sequence of the steps and actual ways of operation in the present embodiment can be adjusted according to practical requirements, and are not limited to those described in the present embodiment.

Figure 3A:
FIG. 3A to 3D are schematic views showing a method for producing the active metal brazing substrate material according to the embodiment of the present disclosure.

As shown in FIG. 3A, step S110 is to provide a ceramic substrate layer 1. The ceramic substrate layer 1 can be, for example, at least one of a silicon nitride (SiN) ceramic substrate, a silicon carbide (SiC) ceramic substrate, an aluminum nitride (AlN) ceramic substrate, and an aluminum oxide ($Al_2O_3$) ceramic substrate. In the present embodiment, the ceramic substrate layer 1 is preferably the silicon nitride (SiN) ceramic substrate.

Figure 3B:
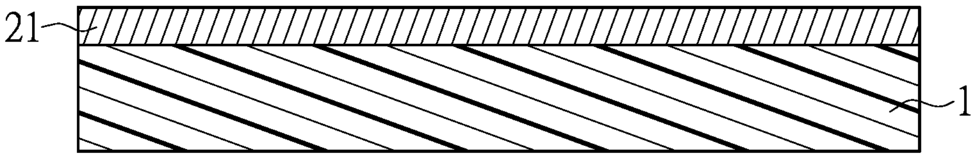

As shown in FIG. 3B, step S120 is to perform a first brazing layer preparation operation, which includes: coating a first active solder paste on a side surface of the ceramic substrate layer 1, and drying the first active solder paste at a high temperature to substantially remove an organic solvent in the first active solder paste, so as to form a first brazing layer 21.

The first active solder paste is prepared by mixing first active solder powders and organic components (e.g., a paste forming agent, an organic solvent, and a thixotropic agent) to form a mixture, and formulating the mixture to a suitable viscosity (e.g., 50 mPa·s to 300 mPa·s), so that the first active solder paste can be easily coated on the ceramic substrate layer 1.

For example, the first active solder paste can be coated on the side surface of the ceramic substrate by screen printing, and dried at a temperature of between 90 °C and 110 °C for 5 minutes to 15 minutes, so that most of the organic solvent in the first active solder paste volatilizes, and the first brazing layer 21 can be formed.

In some embodiments of the present disclosure, a weight ratio of the first active solder powders to the organic components can be 70% to 95%: 5% to 30%, and is preferably 75% to 90%: 10% to 25%.

The first active solder powders are used for forming the above-mentioned first metal composite material. The first active solder powders are formed by mixing silver powders (Ag metal powders), copper powders (Cu metal powders), and the first active metal powders (e.g., Ti metal powders).

A weight ratio among the silver (Ag) powders, the copper (Cu) powders, and the first active metal powders (Ti or $TiH_2$) can be 50 to 75:20 to 49:1 to 5. In a specific embodiment, the weight ratio is 68:28:4, but the present disclosure is not limited thereto.

In the organic components, a weight ratio of the paste forming agent, the organic solvent, and the thixotropic agent can be, for example, 20% to 30%:50% to 70%:1% to 5%.

The paste forming agent can be at least one selected from the group consisting of: silicone oil, white oil, polyvinyl alcohol, acrylic resin, nitrocellulose, ethyl cellulose, dimethyl phthalate, and carboxy-methyl cellulose. Preferably, the paste forming agent is ethyl cellulose.

The organic solvent can be at least one selected from the group consisting of: ethylene glycol butyl ether acetate, diethylene glycol, tri-ethanolamine, butyl cellosolve, tert-butanol, N,N-dimethylformamide, terpineol, and nonyl phenol polyethylene glycol ether. Preferably, the organic solvent is terpineol or ethylene glycol butyl ether acetate.

The thixotropic agent can be at least one selected from the group consisting of: polyamide wax, hydrogenated castor oil, and polyurea. Preferably, the thixotropic agent is polyamide wax.

However, the active solder powders and the organic components of the present disclosure are not limited to those of the above-mentioned embodiments. As long as the active solder powders and the organic components can be formulated into an active solder paste having a viscosity suitable for being coated on a ceramic substrate (which facilitates formation of a brazing layer), the technical solution falls under the spirit and scope of the present disclosure.

Figure 3C:
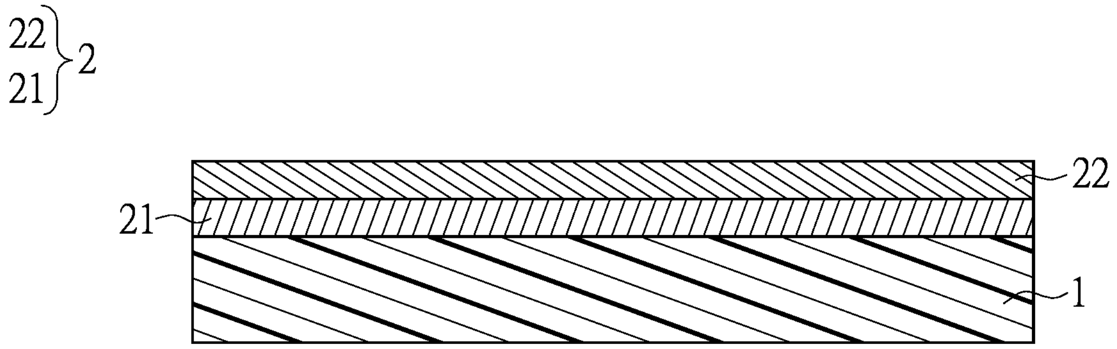

As shown in FIG. 3C, step S130 is to perform a second brazing layer preparation operation, which includes: coating a second active solder paste on a side surface of the first brazing layer 21 away from the ceramic substrate layer 1, and drying the second active solder paste at a high temperature to substantially remove an organic solvent in the second active solder paste, so as to form a second brazing layer 22.

The second active solder paste is prepared by mixing and formulating the second active solder powders and the organic components to a suitable viscosity (e.g., 50 mPa·s to 300 mPa·s), which enables the second active solder paste to be easily coated on the first brazing layer 21. For example, the second active solder paste can be coated on the first brazing layer 21 by screen printing, and can be dried at a temperature of between 90 °C and 110 °C for 5 minutes to 15 minutes, so that most of the organic solvent in the second active solder paste volatilizes to form the second brazing layer 22.

In some embodiments of the present disclosure, a weight ratio of the second active solder powders to the organic components can be 70% to 95%: 5% to 30%, and is preferably 75% to 90%: 10% to 25%.

The second active solder powders are used for forming the above-mentioned second metal composite material. The second active solder powders are formed by mixing low melting point metal powders, copper powders (Cu metal powders), and the second active metal powders (e.g., Ti metal powders).

In addition, a weight ratio among the low melting point metal powders (e.g., Sn powders), the copper (Cu) powders, and the second active metal powders (e.g., Ti powders) can be 10 to 40:55 to 90:1 to 5. For example, in some specific embodiments, the weight ratio of Sn:Cu:Ti can be 23:75:2, but the present disclosure is not limited thereto.

It is worth mentioning that the second active solder powders do not contain any silver (Ag) metal powder.

The content and material types of the organic components in the second active solder paste are similar to those in the first active solder paste, and will not be reiterated herein.

Figure 3D:
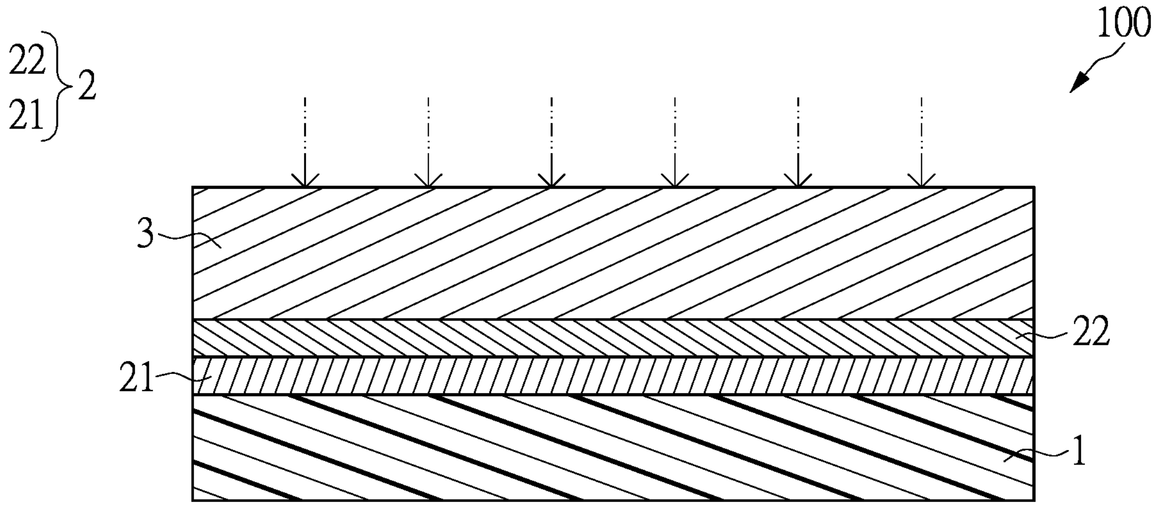

As shown in FIG. 3D, step S140 is to perform a conductive metal layer preparation operation, which includes: disposing a conductive metal layer 3 on a side surface of the second brazing layer 22 away from the first brazing layer 21, and brazing the conductive metal layer 3 onto the ceramic substrate layer 1 through the active metal layer 2 composed of the first brazing layer 21 and the second brazing layer 22 under a high-temperature vacuum sintering process. The conductive metal layer 3 can be, for example, a metal copper foil, a metal aluminum foil, or a copper aluminum alloy foil.

The high-temperature vacuum sintering process can include a first-stage heat treatment procedure and a second-stage heat treatment procedure. A temperature condition of the first-stage heat treatment procedure is not greater than 500 °C, and a temperature condition of the second-stage heat treatment procedure is between 450 °C and 900 °C. (i.e., the brazing temperature range), which is greater than the temperature condition of the first-stage heat treatment procedure.

More specifically, the temperature condition of the first-stage heat treatment procedure is between 300 °C and 500 °C, and a treatment time of the first-stage heat treatment procedure is between 30 minutes and 60 minutes. The temperature condition of the second-stage heat treatment procedure is between 450 °C and 900 °C. (within the brazing temperature range), and a treatment time of the second-stage heat treatment procedure is between 60 minutes and 240 minutes.

In addition, a heating rate of each of the first-stage heat treatment procedure and the second-stage heat treatment procedure can be between 5 °C/min and 30 °C/min. After the high-temperature vacuum sintering process is completed, the active metal layer 2 can be cooled by a cooling rate of between 2 °C/min and 30 °C/min.

It is worth mentioning that, during the high-temperature vacuum sintering process, the organic components in the first brazing layer and the second brazing layer are at least partially vaporized. The first active metal element and the second active metal element (e.g., Ti) can wet the side surface of the ceramic substrate layer 1 and react with the ceramic material (e.g., SiN) to form compounds, such as titanium nitride (TiN), titanium silicide (TiSi), and/or titanium disilicide ($TiSi_2$). In this way, the bonding force between the active metal layer 2 and the ceramic substrate layer 1 can be enhanced. In addition, the second brazing layer 22 can undergo a micron-scale eutectic reaction (i.e., a eutectic reaction between tin and copper) with the metal element (e.g., copper) of the conductive metal layer 3 at an interface there-between, so as to form a solid eutectic structure. Accordingly, the active metal layer 2 can be tightly bonded to the conductive metal layer 3.

It is worth mentioning that a total thickness of the active metal layer 2 (i.e., a sum of the thickness T21 of the first brazing layer 21 and the thickness T22 of the second brazing layer 22) is not less than 12 micrometers, is preferably not less than 15 micrometers, and is more preferably between 15 micrometers and 32 micrometers. A thickness ratio between the thickness T21 of the first brazing layer 21 and the thickness T22 of the second brazing layer 22 is between 15% to 50%: 50% to 85%, and the sum of the two ratios is 100%.

In addition, based on a total weight of all metal elements (i.e., the low melting point metal element, Ag, Cu, and the first and second active metal elements) in the active metal layer 2 being 100 wt %, a content of the low melting point metal element (e.g., Sn) is between 5 wt % and 35 wt %, and is preferably between 10 wt % and 35 wt %. A content of the silver (Ag) metal element is not greater than 45 wt %, and is preferably between 15 wt % and 45 wt %. A total content of the first active metal element and the second active metal element (e.g., Ti metal element) is between 1 wt % and 5 wt %, and is preferably between 2 wt % and 4 wt %. The copper (Cu) metal element is a remaining metal element.

Accordingly, the method for producing the active metal brazing substrate material of the present disclosure can reduce the usage amount of silver (Ag), and reduce the brazing temperature to below 900 °C, thereby reducing the impact of high temperature on metal properties, while simultaneously reducing the material and manufacturing costs.

[Experimental Data and Test Results]

Hereinafter, a detailed description will be provided with reference to Exemplary Examples 1 and 2 and Comparative Examples 1 and 2, in which Exemplary Examples 1 and 2 are the experimental groups that can prove the technical effects of the present disclosure. Comparative Examples 1 and 2 are the experimental groups with poor conditions. However, the following examples are only used to help in the understanding of the present disclosure, and the present disclosure is not limited thereto.

In Exemplary Example 1, an active metal brazing substrate material that includes a first brazing layer and a second brazing layer is prepared according to the conditions shown in Table 1. A preparation method of the active metal brazing substrate material includes: coating a first active solder paste, which contains 68 parts by weight of silver (Ag) powders, 28 parts by weight of copper (Cu) powders, and 4 parts by weight of titanium (Ti) powders, on a side surface of a ceramic substrate, and drying the first active solder paste at a high temperature, so as to form the first brazing layer. Then, a second active solder paste, which contains 75 parts by weight of copper (Cu) powders, 23 parts by weight of low melting point metal powders (Exemplary Example 1 adopts tin Sn powders), and 2 parts by weight of titanium (Ti) powders, is coated on a side surface of the first brazing layer away from the ceramic substrate, and then the second active solder paste is dried at a high temperature to form the second brazing layer. Then, a metal copper foil is further disposed on a side surface of the second brazing layer away from the first brazing layer, so as to form a stacked material. Finally, a high-temperature vacuum sintering process is performed on the stacked material, and the active metal brazing substrate material is formed.

In Exemplary Example 1, the high-temperature vacuum sintering process includes a first-stage heat treatment procedure and a second-stage heat treatment procedure. A temperature condition of the first-stage heat treatment procedure is 650 °C, and a treatment time of the first-stage heat treatment procedure is 30 minutes. A temperature condition of the second-stage heat treatment procedure is 900 °C, and a treatment time of the second-stage heat treatment procedure is 60 minutes. That is, the brazing temperature is between 650 °C and 900 °C. Furthermore, the ceramic substrate is a silicon nitride (SiN) ceramic substrate that has a thickness of 320 micrometers. A thickness of the first brazing layer is 6 micrometers. A thickness of the second brazing layer is 12 micrometers. A thickness of the metal copper foil is 500 micrometers.

The preparation methods of Exemplary Example 2 and Comparative Examples 1 and 2 are substantially the same as that of Exemplary Example 1. The differences are weight ratios and material types of metal elements, thicknesses of brazing layers, and brazing temperatures.

Then, a peeling strength test is performed on each of the active metal brazing substrate materials prepared in Exemplary Examples 1 and 2 and Comparative Examples 1 and 2. The peeling strength test is to test a bonding strength of the brazing layer for bonding the metal copper foil and the ceramic substrate.

The peeling strength test is measured in accordance with JIS-C-6481. A measurement temperature is 25 °C. If the peeling strength is greater than 200 N/cm, the bonding strength is evaluated as excellent. If the peeling strength is greater than 100 N/cm, the bonding strength is evaluated as good. If the peeling strength falls within a range of from 50 N/cm to 100 N/cm, the bonding strength is evaluated as normal. If the peeling strength is less than 50 N/cm, the bonding strength is evaluated as poor.

TABLE 1

| Items | first brazing layer | | |
|---|---|---|---|
| | metal composition | weight ratio | thickness (μm) |
| Exemplary Example 1 | Ag—Cu—Ti | 68:28:4 | 6 |
| Exemplary Example 2 | Ag—Cu—Ti | 68:28:4 | 6 |
| Comparative Example 1 | Cu—Sn | 75:25 | 12 |
| Comparative Example 2 | Ag—Cu—Ti | 68:28:4 | 6 |

| Items | second brazing layer | | | brazing | |
|---|---|---|---|---|---|
| | metal composition | weight ratio | thickness (μm) | temperature (° C.) | bonding strength |
| Exemplary Example 1 | Cu—Sn—Ti | 75:23:2 | 12 | 650-900 | good |
| Exemplary Example 2 | Cu—Sn—Ti | 75:23:2 | 12 | 450-850 | excellent |
| Comparative Example 1 | Cu—Sn | 75:25 | 12 | 650-900 | poor |
| Comparative Example 2 | Cu—Sn—Ti | 75:23:2 | 6 | 450-850 | poor |

Test result and discussion are as follows.

From the test results shown in Table 1, it can be known that the metal compositions of the first brazing layers in Exemplary Examples 1 and 2 are both Ag—Cu—Ti, and the weight ratios thereof are both in a range of 50 to 75:20 to 48:2 to 5. The metal compositions of the second brazing layers are both Cu—Sn—Ti, and the weight ratios thereof are both in a range of 55 to 90:10 to 40:1 to 5. Furthermore, the thicknesses of the first brazing layers are both not less than 5 micrometers. The test result of the peeling strength of the active metal brazing substrate material of Exemplary Example 1 is greater than 100 N/cm, so that the bonding strength thereof is evaluated as good. Exemplary Example 2 uses a brazing temperature lower than that of Exemplary Example 1. Surprisingly, the peeling strength test result of the active metal brazing substrate material in Exemplary Example 2 is greater than 200 N/cm, so that the bonding strength thereof is evaluated as excellent (which is significantly higher than that of Exemplary Example 1). That is to say, under a specific brazing layer composition, moderately reducing the brazing temperature can help improve the peeling strength of the active metal brazing substrate material.

The metal elements used in the first brazing layer and the second brazing layer in Comparative Example 1 are both Cu—Sn without using Ag—Cu—Ti or Cu—Sn—Ti. The active metal brazing substrate material of Comparative Example 1 has a peeling strength of less than 50 N/cm, so that the evaluation of the bonding strength is poor. The total thickness of the first brazing layer and the second brazing layer in Comparative Example 2 is 12 micrometers, and the total thickness is too low, thereby resulting in a peeling strength of less than 50 N/cm. As such, the evaluation of the bonding strength is poor.

[Beneficial Effects of the Embodiments]

In conclusion, in the active metal brazing (AMB) substrate material and the method for producing the same provided by the present disclosure, through the configuration of the first brazing layer and the second brazing layer, the usage amount of the silver metal element can be reduced, and the brazing temperature can be lowered to below 900 °C, thereby reducing the impact of high temperature on metal properties, while simultaneously reducing the material costs and the manufacturing costs.

More specifically, in the present disclosure, the second brazing layer is disposed between the first brazing layer and the conductive metal layer. The second brazing layer contains the low melting point metal element, but does not contain the silver (Ag) metal element. The second brazing layer is configured to have a certain thickness, so that the content of the silver (Ag) metal element in the active metal layer can be reduced, thereby effectively reducing the material cost and the manufacturing cost of the active metal brazing ceramic substrate. In addition, the problem of electro-migration caused by silver residues can also be effectively improved.

Lastly, the active metal brazing (AMB) substrate material of the present disclosure can further be etched to form a circuit pattern on the ceramic substrate by exposure and development, and can be applied to a high-power module for energy conversion, an electric vehicle, and a charging system.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An active metal brazing substrate material, comprising:

a ceramic substrate layer;

an active metal layer including:

a first brazing layer disposed on a side surface of the ceramic substrate layer, wherein a composition of the first brazing layer includes a first metal composite material, and the first metal composite material includes a silver (Ag) metal element, a copper (Cu) metal element, and a first active metal element; wherein, based on a total weight of the first metal composite material being 100 parts by weight, a content of the silver (Ag) metal element is not less than 50 parts by weight; and a second brazing layer disposed on a side surface of the first brazing layer away from the ceramic substrate layer, wherein a composition of the second brazing layer includes a second metal composite material, the second metal composite material includes a low melting point metal element, a copper (Cu) metal element, and a second active metal element, and the second metal composite material does not include any silver (Ag) metal element;

wherein a melting point of the low melting point metal element is between 130 °C and 350 °C;

wherein, based on a total weight of the second metal composite material being 100 parts by weight, a total content of the low melting point metal element is between 10 parts by weight and 40 parts by weight;

wherein a sum of a thickness of the first brazing layer and a thickness of the second brazing layer is not less than 15 micrometers, the thickness of the first brazing layer is not less than 5 micrometers, and the thickness of the second brazing layer is not less than 10 micrometers; and a conductive metal layer disposed on a side surface of the second brazing layer away from the first brazing layer.

2. The active metal brazing substrate material according to claim 1, wherein the low melting point metal element has a liquid density of between 5 g/cm$^3$ and 12 g/cm$^3$ at the melting point, and an electrical resistivity of not greater than 1500 nΩ·m at 25 °C.

3. The active metal brazing substrate material according to claim 1, wherein the low melting point metal element is at least one of a tin (Sn) metal element, a bismuth (Bi) metal element, an indium (In) metal element, a lead (Pb) metal element, and a cadmium (Cd) metal element.

4. The active metal brazing substrate material according to claim 1, wherein, based on a total weight of all metal elements in the active metal layer being 100 wt %, the total content, by weight, of the low melting point metal element is between 5 wt % and 35 wt %, the content, by weight, of the silver (Ag) metal element is not greater than 45 wt %, a total content, by weight, of the first active metal element and the second active metal element is between 1 wt % and 5 wt %, and the copper (Cu) metal element is a remaining metal element.

5. The active metal brazing substrate material according to claim 1, wherein a content, by weight, of the copper (Cu) metal element in the second brazing layer is greater than the total content, by weight, of the low melting point metal element in the second brazing layer, and the content, by weight, of the copper (Cu) metal element in the second brazing layer is greater than a content, by weight, of the copper (Cu) metal element in the first brazing layer.

6. The active metal brazing substrate material according to claim 1, wherein, in the active metal layer, a thickness ratio between the thickness of the first brazing layer and the thickness of the second brazing layer is 15% to 50%: 50% to 85%.

7. The active metal brazing substrate material according to claim 1, wherein the first active metal element is at least one selected from the group consisting of titanium (Ti), zirconium (Zr), tantalum (Ta), niobium (Nb), vanadium (V), hafnium (Hf), titanium hydride ($TiH_2$), zirconium hydride ($ZrH_2$), tantalum hydride ($TaH_2$), niobium hydride (NbH), vanadium hydride ($VH_2$), and hafnium hydride ($H_2Hf_2$); wherein the second active metal element is at least one selected from the group consisting of titanium (Ti), zirconium (Zr), tantalum (Ta), niobium (Nb), vanadium (V), hafnium (Hf), titanium hydride ($TiH_2$), zirconium hydride ($ZrH_2$), tantalum hydride ($TaH_2$), niobium hydride (NbH), vanadium hydride ($VH_2$), and hafnium hydride ($H_2Hf_2$); wherein the ceramic substrate layer is at least one of a silicon nitride ceramic substrate, a silicon carbide ceramic substrate, an aluminum nitride ceramic substrate, and an alumina ceramic substrate; and wherein the conductive metal layer is at least one of a metal copper foil, a metal aluminum foil, and a copper-aluminum alloy foil.

* * * * *